(12) United States Patent
Lee et al.

(10) Patent No.: US 9,113,586 B2
(45) Date of Patent: Aug. 18, 2015

(54) DEVICE FOR BONDING FLEXIBLE PCB TO CAMERA MODULE

(71) Applicants: LG INNOTEK CO., LTD., Seoul (KR); KAIST (Korea Advanced Institute of Science and Technology), Daejeon (KR)

(72) Inventors: Jae Chun Lee, Seoul (KR); Kyuong-wook Paik, Daejeon (KR); Yoo Sun Kim, Daejeon (KR); Kiwon Lee, Daejeon (KR)

(73) Assignees: LG INNOTEK CO., LTD., Seoul (KR); KAIST (KOREA ADVANCED INSTITUTE OF SCIENCE AND TECHNOLOGY), Daejeon (KR)

( * ) Notice: Subject to any disclaimer, the term of this patent is extended or adjusted under 35 U.S.C. 154(b) by 40 days.

(21) Appl. No.: 13/774,675

(22) Filed: Feb. 22, 2013

(65) Prior Publication Data

US 2013/0221067 A1    Aug. 29, 2013

(30) Foreign Application Priority Data

Feb. 24, 2012    (KR) .................. 10-2012-0019108

(51) Int. Cl.
*B23K 1/06* (2006.01)
*H05K 13/04* (2006.01)
(Continued)

(52) U.S. Cl.
CPC ............... *H05K 13/046* (2013.01); *B23K 1/06* (2013.01); *B23K 20/00* (2013.01); *B23K 20/02* (2013.01); *B23K 20/023* (2013.01); *B23K 20/10* (2013.01);
(Continued)

(58) Field of Classification Search
CPC ...... B23K 20/00; B23K 20/02; B23K 20/023; B23K 20/10; B23K 20/106; B23K 1/06
USPC ............... 228/110.1, 1.1, 111, 227, 228, 230
See application file for complete search history.

(56) References Cited

U.S. PATENT DOCUMENTS 5,934,996 A * 8/1999 Nagai et al. .................. 438/617
6,105,848 A * 8/2000 Horibe et al. ............. 228/110.1
(Continued)

FOREIGN PATENT DOCUMENTS

JP         11-26922 A        1/1999
JP         11119841 A  *     4/1999
KR     10-2012-0007730 A    1/2012

OTHER PUBLICATIONS

JP 11-026922A english computer translation.*
JP 11-119841A english computer translation.*

*Primary Examiner* — Erin Saad
(74) *Attorney, Agent, or Firm* — Birch, Stewart, Kolasch & Birch, LLP

(57) ABSTRACT

Disclosed is a device for bonding a flexible PCB (Printed Circuit Board) to a camera module, the device according to an exemplary embodiment of the present disclosure comprising a thermo-compression unit configured to bond the camera module to the flexible PCB using an conductive film by applying heat and pressure to the conductive film between the camera module and the flexible PCB, an ultrasonic wave bonding unit configured to directly transmit ultrasonic wave vibration energy to the camera module to remove an oxide film on connection particles intrinsically formed inside the conducive film, and a controller configured to activate the ultrasonic wave bonding unit when a temperature of the conductive film rises to a predetermined temperature.

7 Claims, 4 Drawing Sheets

(51) Int. Cl.
  *B23K 20/10*     (2006.01)
  *B23K 20/02*     (2006.01)
  *B23K 20/00*     (2006.01)
  *H01R 43/02*     (2006.01)

(52) U.S. Cl.
  CPC .......... *B23K 20/106* (2013.01); *H01R 43/0207* (2013.01); *B23K 2201/42* (2013.01)

(56) References Cited

U.S. PATENT DOCUMENTS

2010/0206457 A1* 8/2010 Kim et al. .................... 156/73.1
2011/0155789 A1* 6/2011 Aoyagi et al. ................. 228/1.1

* cited by examiner

DEVICE FOR BONDING FLEXIBLE PCB TO CAMERA MODULE

CROSS-REFERENCE TO RELATED APPLICATION

The present application is based on, and claims priority from the Korean Application Number 10-2012-0019108, filed on Feb. 24, 2012, the disclosure of which is incorporated by reference herein in its entirety.

BACKGROUND OF THE DISCLOSURE

1. Field of the Disclosure

The present disclosure relates to a device for bonding a flexible PCB to a camera module.

2. Discussion of the Related Art

This section provides background information related to the present disclosure which is not necessarily prior art.

Generally, methods bonding polymer resin adhesive include an ultrasonic wave bonding method and a thermo-compression bonding method. An ultrasonic wave bonding device includes an ultrasonic vibrator generating ultrasonic wave, and an ultrasonic horn converting ultrasound generated by the ultrasonic vibrator to vibration energy to bond a bonding object.

That is, in a case the ultrasonic wave vibration energy is transmitted to the bonding object via the ultrasonic horn, an instant frictional heat is generated from an adhesive installed on an adhesive surface of the bonding object. The adhesive is melted by the frictional heat to bond the bonding object.

A thermo-compression bonding device mutually bonds fusing objects by applying heat and pressure thereto, and may take various shapes according to materials and shapes of the fusing objects. The thermo-compression bonding device generates heat using a power supply from an outside, and uses the heat to bond the bonding objects.

The ultrasonic wave and thermo-compression bonding devices use polymer resin adhesives when bonding the bonding objects, where a representative polymer resin adhesive is an ACF (Anisotropic Conductive Film, hereinafter referred to as conductive film). The ACF, consisting of an insulating adhesive polymer resin (matrix) with dispersed conductive particles, may be adhesive materials that simultaneously perform electrical interconnection of electrodes via conductive particles based on an insulating polymer resin and conductive particles dispersed in the polymer resin, and mechanical connection via thermal curing of the polymer resin.

In general, fine particles, such as gold, copper, nickel, carbon, a metal-coated polymer, an intrinsically conductive polymer and the like are used as conductive particles, and an epoxy resin, a polyimide resin, a silicon resin, an acrylic resin, a polyester resin or a polysulfone resin are used as a polymer resin. According to fields of application, the types of conductive particles may vary, and they may include non-conductive particles for the purpose of reducing a coefficient of thermal expansion.

In the method of interconnecting electronic components using an anisotropic conductive adhesive, there are advantages in that it is clean, simple and environmentally friendly because an existing soldering process is replaced with a lead-free process, it is more thermally stable because there is no need to apply the instantaneous temperature to the product (low temperature process), the cost of the process can be reduced by using a cheap substrate, such as a glass substrate or polyester flex, and an ultra-fine electrode pitch can be implemented via electrical connection using fine conductive particles.

The anisotropic conductive adhesives having these advantages are widely used in applications such as smart cards, liquid crystal displays (LCD), plasma display panels (PDP), display packaging of organic light emitting diodes, computers, portable telephones, communication systems and the like.

The anisotropic conductive adhesives are commonly used in display module mounting technologies for outer lead bonding (OLB) when connecting a flexible substrate to a glass substrate and for bonding the flexible substrate with a printed circuit board (PCB). The market for anisotropic conductive adhesives is growing rapidly.

In addition, the importance of anisotropic conductive adhesives is also increasing rapidly, in bonding processes of a COG (Chip On Glass), in which a driving circuit IC chip is directly connected to the glass substrate, and a COF (Chip On Film), in which a flip chip is directly connected to the flexible substrate, since a connection having an ultra-fine pitch is required due to the increasing densification and complexity of the driving circuit IC.

In the mounting technology of the electronic components using the anisotropic conductive adhesive, connection is achieved via electrical conduction of conductive particles between electrode pads using a thermo-compression process and thermo-setting of a polymer resin.

The thermo-setting polymer resin of conductive film gets faster in thermo-setting reaction speed as temperature rises, such that if the temperature rises high, a faster bonding operation can be performed. However, an excessive high temperature may cause several problems such as thermal deformation of conductive film and decreased in physical properties.

In addition, structurally weak structures such as camera modules of mobile terminals may be damaged due to high temperature and high pressure if applied with the ultrasonic wave and thermo-compression bonding processes. It is, therefore, desirable to overcome the above problems and others by providing a countermeasure to cope with these disadvantages.

SUMMARY OF THE DISCLOSURE

This section provides a general summary of the disclosure, and is not a comprehensive disclosure of its full scope or all of its features.

The present disclosure is directed to cope with the above-mentioned problems/disadvantages and to provide a device for bonding a flexible PCB to a camera module configured to effectively bond the flexible PCB to the camera module by combining ultrasonic wave and thermo-compression bonding processes.

Technical problems to be solved by the present disclosure are not restricted to the above-mentioned description, and any other technical problems not mentioned so far will be clearly appreciated from the following description by the skilled in the art.

In an exemplary embodiment of the present disclosure, there is provided a device for bonding a flexible PCB (Printed Circuit Board) to a camera module, the device comprising: a thermo-compression unit configured to bond the camera module to the flexible PCB using an conductive film by applying heat and pressure to the conductive film between the camera module and the flexible PCB; an ultrasonic wave bonding unit configured to directly transmit ultrasonic wave vibration energy to the camera module to remove an oxide film on connection particles intrinsically formed inside the conducive film; and a controller configured to activate the ultrasonic wave bonding unit when a temperature of the conductive film rises to a predetermined temperature.

In an exemplary embodiment of the present disclosure, the conductive film may comprises an insulating polymer resin, and conductive connection particles electrically contacting the camera module and the flexible PCB by being formed inside the polymer resin.

In an exemplary embodiment of the present disclosure, the insulating polymer resin may include epoxy resin, polyimide resin, acrylic resin, polyester resin, polysulfone resin and polystyrene resin, or a mixture of two or more selected from the epoxy resin, polyimide resin, acrylic resin, polyester resin, polysulfone resin and polystyrene resin.

In an exemplary embodiment of the present disclosure, the connection particles may include an Sn-based alloy, an Sn/Bi based alloy, an Sn/Zn based alloy, an Sn/Ag based alloy and an Sn/Ag/Au based alloy, or a mixture of two or more selected from the Sn-based alloy, Sn/Bi based alloy, Sn/Zn based alloy, Sn/Ag based alloy and the Sn/Ag/Au based alloy.

In an exemplary embodiment of the present disclosure, the connection particles may be melted at a predetermined temperature or more.

In an exemplary embodiment of the present disclosure, the ultrasonic wave bonding unit comprises an ultrasonic oscillator configured to convert a normal power source supplied from outside to electric energy of ultrasonic wave frequency and output the electric energy, and an ultrasonic vibrator positioned at a lateral surface of the camera module to convert the electric energy supplied from the ultrasonic oscillator to mechanical vibration energy and transmit the mechanical vibration energy to the lateral surface of the camera module.

In an exemplary embodiment of the present disclosure, the thermo-compression unit comprises a power supply unit configured to convert a normal power source supplied from outside and output the converted power source, a thermal compressor positioned at an upper surface of the camera module to heat the conductive film to a predetermined temperature using the power source inputted from the power supply unit, and to apply pressure to the conductive film positioned at the upper surface of the camera module, and driving means configured to vertically move the thermal compressor.

In an exemplary embodiment of the present disclosure, the controller may be further configured to control the power supply unit to convert the normal power source to a necessary power source.

In an exemplary embodiment of the present disclosure, the device may further comprise a memory configured to store a time required to raise the temperature of the conductive film to the predetermined temperature in response to the thermal compression of the thermal compression unit.

In an exemplary embodiment of the present disclosure, the controller may be further configured to activate the ultrasonic wave bonding unit when the required time lapses after start of the thermal compression by the thermal compression unit.

In an exemplary embodiment of the present disclosure, the controller may be further configured to control amplitude and operation time of vibration energy generated by the ultrasonic wave bonding unit.

The device for bonding flexible PCB to camera module according to exemplary embodiments of the present disclosure has an advantageous effect in that the ultrasonic wave bonding unit and the thermal compression unit can be separated and individually operated to enable an independent control of pressure, temperature, ultrasonic amplitude and bonding time of each head, and an oxide film of connection particles can be removed without any damage to the camera module caused by ultrasonic vibration because the ultrasonic vibration is applied via the ultrasonic wave bonding unit, whereby electrical bonding force between electrodes of the camera module and connection particles can be increased to enhance reliability of the product.

BRIEF DESCRIPTION OF THE DRAWINGS

The accompanying drawings, which are included to provide a further understanding of the present disclosure and are incorporated in the present disclosure and constitute a part of this application, and together with the description, serve to explain the principle of the disclosure. In the drawings.

DETAILED DESCRIPTION

Advantages and features of the present disclosure may be understood more readily by reference to the following detailed description of exemplary embodiments and the accompanying drawings. Thus, the present disclosure is not limited to the exemplary embodiments which will be described below, but may be implemented in other forms. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Now, a device for bonding a flexible PCB to a camera module according to the exemplary embodiments of the present disclosure will be described in detail with reference to the accompanying drawings.

Figure 1:
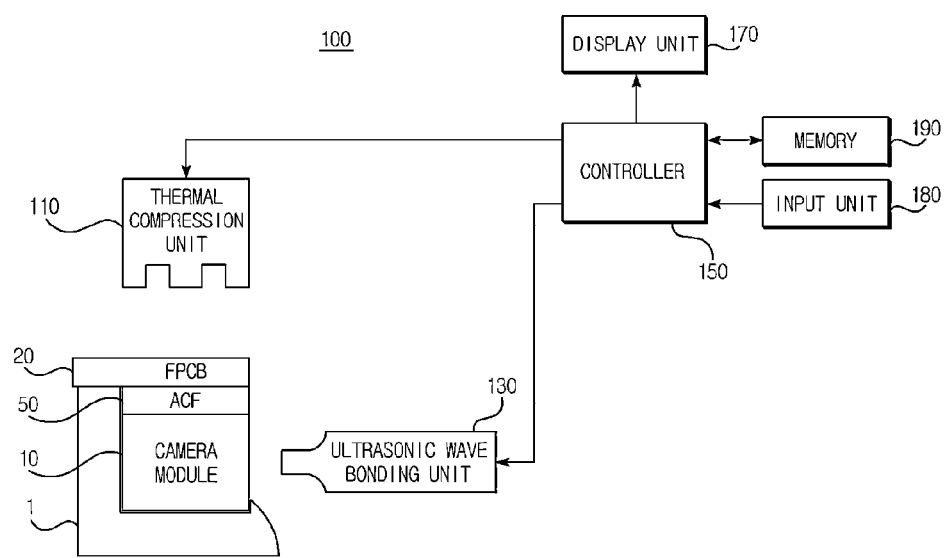
FIG. 1 is a conceptual block diagram illustrating a device for bonding a flexible PCB to a camera module according to an exemplary embodiment of the present disclosure.

FIG. 1 is a conceptual block diagram illustrating a device 100 for bonding a flexible PCB to a camera module according to an exemplary embodiment of the present disclosure, where the device 100 may comprise a thermal compression unit 110, an ultrasonic wave bonding unit 130 and a controller 150.

The thermal compression unit 110 may be arranged at an upper surface of a camera module 10, where heat and pressure are applied to an ACF (Anisotropic Conductive Film, 50) interposed between the camera module 10 and a flexible PCB 20 to bond the camera module 10 and the flexible PCB 20.

The ultrasonic wave bonding unit 130 may be arranged at a lateral surface of the camera module 10 to directly transmit ultrasonic vibration energy to the lateral surface of the camera module during operation of the thermal compression unit 110, whereby oxide film of connection particles 50 intrinsically disposed inside the conductive film 50 to enhance an electrical bondage between the camera module and the flexible PCB 20.

The controller 150 individually controls the thermal compression unit 110 and the ultrasonic wave bonding unit 130, where the ultrasonic wave bonding unit 130 may be also operated during thermal compression of the conductive film 50 via the thermal compression unit 110 to enhance the electrical bondage between the camera module 10 and the flexible PCB 20.

Referring to FIG. 1, the device 100 may further comprise a display unit 170 displaying any one of a heating temperature of the thermal compression unit 110 and a waveform of electrical energy outputted by the ultrasonic wave bonding unit 130 in response to a control signal of the controller 150, an input unit 180 inputting various set values such as a target heating temperature of the thermal compression unit 110 and an operation time of the ultrasonic wave bonding unit 130 or a command, and a memory 190 storing data such as control-related set values or operation times of the ultrasonic wave bonding unit 130 and the thermal compression unit 110.

The display unit 170 may be an LED (Light Emitting Diode, 7-segment) or an LCD (Liquid Crystal Display), but the present disclosure is not limited thereto.

Figure 2:
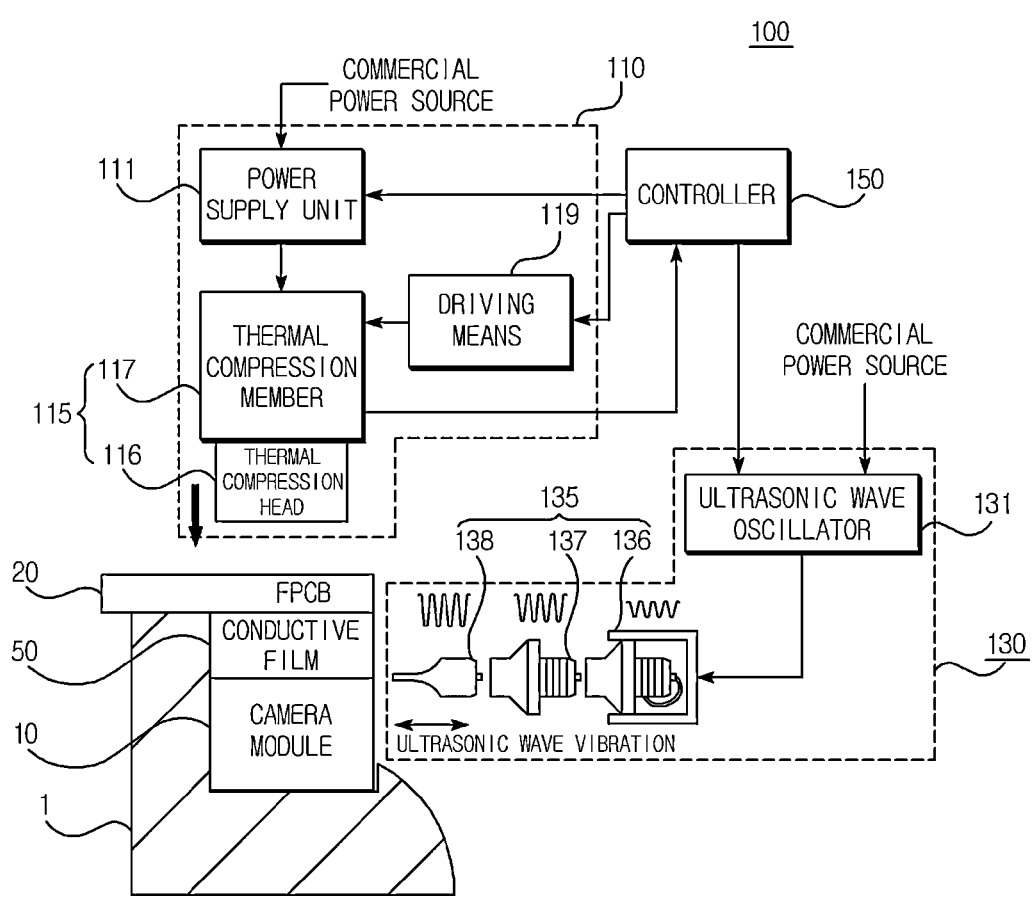
FIG. 2 is a schematic block diagram illustrating a device for bonding a flexible PCB to a camera module according to an exemplary embodiment of the present disclosure.

Detailed configuration of the ultrasonic wave bonding unit 130 and the thermal compression unit 110 is provided in FIG. 2. Referring to FIG. 2, the thermal compression unit 110 may comprise a power supply unit 111, a thermal compressor 115 and driving means 119, and the ultrasonic wave bonding unit 130 may comprise an ultrasonic oscillator 131 and an ultrasonic vibrator 135.

The power supply unit 111 of the thermal compression unit 110 may convert a normal power source (AC 110V or AC 220V) supplied from outside to a necessary voltage or current in response to a control signal of the controller 150 and output the converted power source. The power supply unit 111 may be selectively operated to supply a power source or to change an output current.

The thermal compressor 115 may be arranged at an upper surface of the camera module 10 to be heated by the power source supplied from the power supply unit 111 and to apply pressure to bonding objects of camera module 10 and the flexible PCB 20 and to thermally compress the camera module 10 and the flexible PCB 20 via the conductive film 50. The thermal compressor 115 may comprise a thermal compression head 116 thermally compressing the camera module 10 and a thermal compression member 117 intrinsically comprising a heater heating the thermal compression head 116.

The driving means 119 may vertically move the thermal compressor 115 in response to a control signal of the controller 150. The ultrasonic wave oscillator 131 of the ultrasonic wave bonding unit 130 may convert the normal power source (AC 110V or AC 220V) supplied from outside to an electrical energy of ultrasonic wave and output a converted power source. The ultrasonic wave oscillator 131 may convert the normal power source (50 Hz to 60 Hz) supplied from outside to ultrasonic wave (15 kHz to 40 kHz) and output the converted ultrasonic wave.

The ultrasonic vibrator 135 may be arranged at a lateral surface of the camera module 10 to convert the electrical energy applied from the ultrasonic wave oscillator 131 to mechanical vibration energy and to transmit the converted mechanical vibration energy to the conductive film 50 interposed between the camera module 10 and the flexible PCB 20. The ultrasonic vibrator 135 may comprise a converter 136 converting the electrical energy applied from the ultrasonic wave oscillator 131 to the mechanical vibration energy, a booster 137 amplifying amplitude of the mechanical vibration energy, and an ultrasonic horn 138 transmitting the mechanical vibration energy outputted by the booster 137 to the camera module 10.

The camera module 10 in the exemplary embodiment of the present disclosure may be a structurally weak camera module for a mobile terminal. Of course, the bonding object according to the exemplary embodiment of the present disclosure is not limited to the camera module for mobile terminal and may be expanded to all structurally weak electronic parts.

Figure 3:
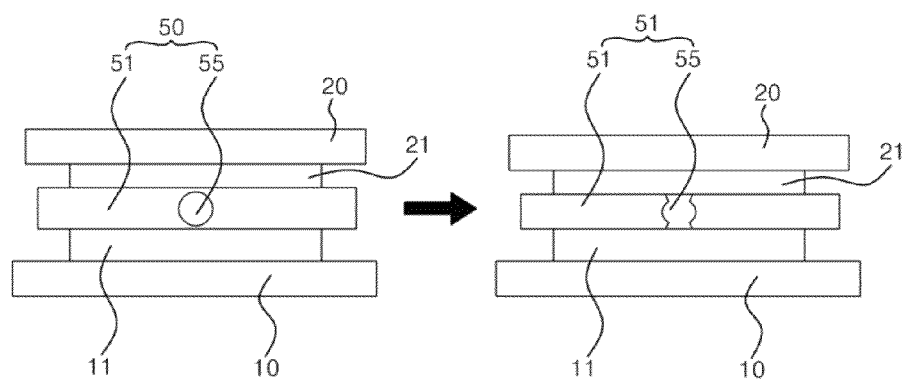
FIG. 3 is a schematic view of a bonded state of conductive film of FIG. 2.

At this time, the conductive film 50 may be arranged between the camera module 10 and the flexible PCB 20 as shown in FIG. 3. Furthermore, the bonding objects, which are the camera module 10 and the flexible PCB 20, may be respectively formed with electrodes 11, 21. The conductive film 50 may comprise an insulating polymer resin 51, and conductive connection particles 55 formed inside the insulating polymer resin 51 to surface-contact each electrode 11, 21 of the camera module 10 and the flexible PCB 20. At this time, the insulating polymer resin 51 may include a thermosetting polymer resin or a thermoplastic polymer resin, and may include thermosetting polymer resin, for example. The conductive film 50 according to an exemplary embodiment of the present disclosure may take a shape of a film or a paste, and may include an ACF, for example.

The polymer resin 51 is resin that is cured in a temperature range of 90° C. to 300° C., and may include epoxy resin, polyimide resin, acrylic resin, polyester resin, polysulfone resin, and polystyrene resin or a mixture of two or more selected from the epoxy resin, polyimide resin, acrylic resin, polyester resin, polysulfone resin, and polystyrene resin. If the polymer resin 51 is not thermosetting polymer resin, but thermoplastic polymer resin, fusion (melting), instead of curing or hardening, may be generated by ultrasonic wave or heat.

A particle diameter of the connection particles 55, being metal materials formed in square shape prior to fusion, may be 3 μm to 100 μm, for example, but is not limited thereto. The connection particles 55 may be an Sn-based alloy, an Sn/Bi based alloy, an Sn/Zn based alloy, an Sn/Ag based alloy, and an Sn/Ag/Au based alloy, or a mixture of two or more selected from the Sn-based alloy, Sn/Bi based alloy, Sn/Zn based alloy, Sn/Ag based alloy, and the Sn/Ag/Au based alloy, where the connection particles 55 may be fused or melted at a temperature above a predetermined level (120° C.) or more.

As a result, heat is transmitted to the conductive film 50 arranged between the camera module 10 and the flexible PCB 20 in response to compression by the thermal compressor 115, and the connection particles 55 inside the conductive film 50 may be melted by the transmitted heat by being surface-contacted to the camera module 10 and each electrode 11, 21 of the flexible PCB 20. Temperature inside the connection particles 55 may further increase in response to ultrasonic vibration generated by the ultrasonic vibrator 135, and oxide film formed on surfaces of the connection particles 55 may be broken by shock of the ultrasonic vibration to enhance melting reliability and electrical bonding force.

In addition, the polymer resin 51 is changed to liquefied state in response to the generated heat to mechanically bond the camera module 10 and the flexible PCB 20, but is cured after lapse of a predetermined time at a temperature above a predetermined level. That is, in a case heat is applied to the conductive film 50, the polymer resin starts to change to liquefied state, and the curing or hardening of the polymer resin is realized at a time when the fusion or melting of the connection particles 55 inside the polymer resin 51 is completed. Thus, the conductive film 50 can mutually bond the camera module 10 and the flexible PCB 20 mechanically and electrically.

The application of ultrasonic wave to the camera module 10 means that ultrasonic vibration has been applied to the conductive film 50, where the ultrasonic vibration includes vibration accompanied by a predetermined pressure. The ultrasonic wave applied to the conductive film 50 induces plastic deformation of the polymer resin 51 contained in the conductive film 50, and the polymer resin 51 is self-heated by the plastic deformation. The temperature of the conductive film 50 increases to a temperature above a melting temperature and a curing temperature of the polymer resin 51 in response to the self-heating of the polymer resin 51 caused by application of ultrasonic wave.

At this time, the thermosetting polymer resin 51 of the conductive film 50 increases a thermosetting reaction speed as the temperature rises, whereby a faster bonding can be achieved as the temperature goes up. However, an excessively high temperature may cause thermal deformation and degradation of physical properties in the conductive film 50, and have a bad influence on the camera module 10, such that an appropriate temperature adjustment is importantly required.

Now, an operational process of the device for bonding flexible PCB to a camera module according to an exemplary embodiment of the present disclosure will be briefly described.

First, the camera module 10 may be arranged on a support fixture 1 positioned at a bottom surface of the thermal compressor 115, and the conductive film 50 may be interposed between the camera module 10 and the flexible PCB 20, which are bonding objects. Under this circumstance, the power supply unit 111 may receive the normal power source (AC 110V or AC 220V) supplied from outside, convert the normal power source (AC 110V or AC 220V) supplied from outside to a necessary voltage in response to the control signal of the controller 150, and supply the converted voltage to a heater inside the thermal compression member 117. The thermal compression member 117 is heated to a high temperature in response to an output of the power supply unit 111, where the output of the power supply unit 111 may be determined by setting of the controller 150.

In a case the thermal compression member 117 of the thermal compressor 115 is heated to a set-up temperature, 300° C., for example, the controller 150 controls the driving means 119, whereby the thermal compressor 115 is lowered to apply pressure to the camera module 10. The controller 150 can monitor the temperature of the thermal compression member 117 by measuring a heating temperature of the thermal compression member 117 using a thermocouple or a temperature sensor.

In a case whereby the thermal compressor 115 is lowered to apply pressure to an upper surface of the flexible PCB 20, heat is transferred to the conductive film 50 interposed between the camera module 10 and the flexible PCB 20, where the conductive film 50 starts to rise in temperature by the transferred heat. In a case the thermal compressor 115 is compressed to the conductive film 50, the conductive film 50 may rise to a temperature where the connection particles 55 are melted at a room temperature as time lapses. At this time, in a case the melting temperature of the connection particles 55 is 140° C., the heating temperature of the thermal compressor 115 may be so set as to increase the conductive film 50 to a temperature at least above 140° C.

Successively, the controller 150 may determine whether the set time has lapsed after the thermal compression. In a case the temperature of the thermal compressor 115 is 300° C., for example, the set time would be 2 seconds after the thermal compression because it would take approximately 2 seconds for the conductive film 50 to rise to the approximate temperature of 140° C., which is the set temperature.

As noted above, the time for the conductive film 50 to rise from the room temperature to the set time can be monitored through temperature and time by installing in advance a temperature sensor such as a thermocouple at the conductive film 50 side time, and the time spent by the conductive film 50 to rise to a predetermined time after the thermal compression may be stored in the memory 190.

In a case the set time lapses after the thermal compression, the controller 150 may activate the ultrasonic vibrator 135 positioned at a lateral surface of the camera module 10, whereby the conductive film 50 generates a frictional heat in response of ultrasonic vibration in the range of 15,000 to 40,000 times per second, and the superficial oxide film on the connection particles 55 inside the conductive film 50 can be removed by the vibration.

At this time, output amplitude of the ultrasonic vibration energy may be in the range of 8 μm~12 μm. In this case, in a case the amplitude is less than 8 μm, it is difficult to remove the oxide film of the connection particles 55, and in a case the amplitude is more than 12 μm, the camera module 10 may be broken due to weak structure, if the camera module is for mobile terminal.

At this time, the polymer resin 51 of the conductive film 50 may be temporarily changed from a solid state to a liquefied state by the thermal compressor 115 in a section where temperature rises from the room temperature to the set temperature, and the connection particles 55 intrinsically disposed inside the conductive film 50 starts to melt. At this time, in a case the controller 150 activates the ultrasonic vibrator 135, the connection particles 5 of the conductive film 50 are removed as the oxide film is destructed by shocks from the ultrasonic vibration.

The oxide film formed on the surface of the connection particles 55, which is a factor inhibiting an electrical bonding between the connection particles 55 and the electrodes 11, 21, is preferred to be removed. Although the oxide film of the connection particles 55 may be removed by heat of high temperature, the high temperature may damage the camera module 10 or the conductive film 50 such that use of high temperature is not preferable.

Figure 4:
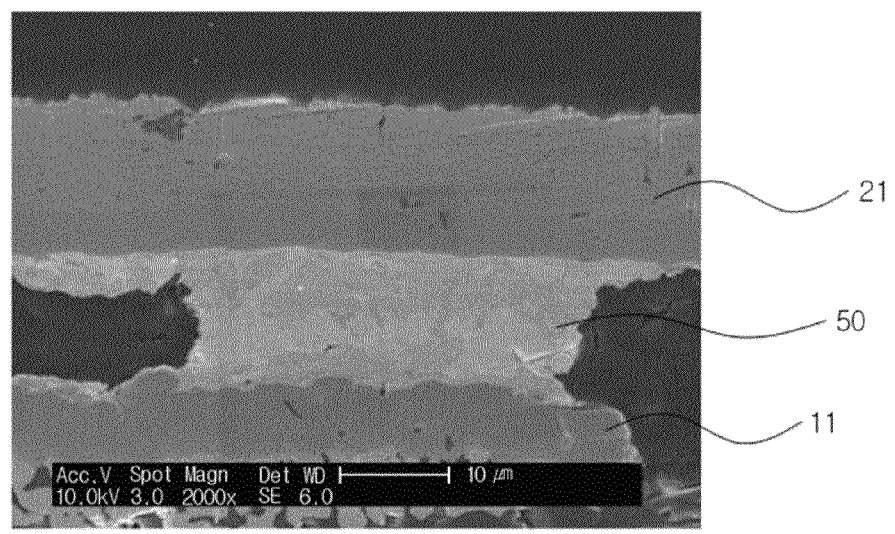
FIGS. 4 and 5 are schematic views of a bonded state of conductive film.

As noted above, as the polymer resin 51 of the conductive film 50 starts to be changed to a liquefied state by the heat transferred from the thermal compressor 115, and the connection particles 55 starts to melt, the oxide film of the connection particles 55 is removed by the ultrasonic vibration transmitted by the ultrasonic vibrator 135 to allow the connection particles 55 to form a strong molecular coupling between the camera module 10 and each of the electrodes of the flexible PCB 20 as illustrated in FIG. 4.

Figure 5:
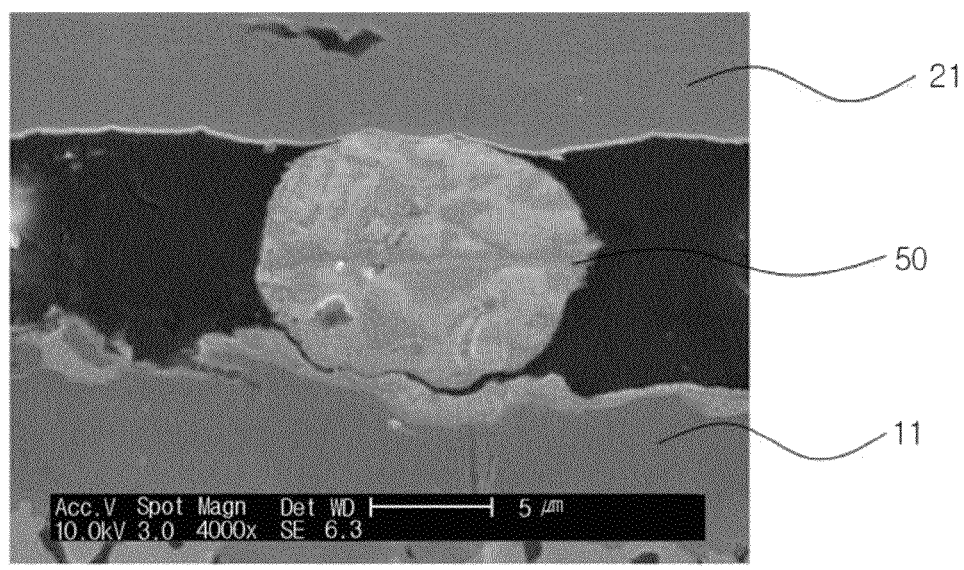

Of course, the polymer resin 51 of the conductive film 50 starts to harden as the camera module 10 and each of the electrodes 11, 21 of the flexible PCB 20 are melted and bonded by the connection particles 55. If the camera module 10 and each of the electrodes 11, 21 of the flexible PCB 20 are melted and bonded only by the thermal compressor 115 instead of ultrasonic vibration, the oxide film of the connection particles 55 intrinsically disposed inside the conductive film 50 is not removed, as illustrated in FIG. 5, to decrease the reliability of surface-bonding with the electrodes, making it difficult to allow the present disclosure to be put to commercialization.

Successively, the controller 150 activates the ultrasonic vibrator 135 for a preset time and continues to apply the thermal compression to the thermal compressor 115 to a preset time, whereby the polymer resin 51 of the conductive film 50 is fully cured to complete the bonding between the camera module 10 and the electrodes 11, 21 of the flexible PCB 20.

Although the polymer resin 51 is cured at a temperature above a predetermined level, it takes a predetermined time for the polymer resin 51 to completely cure. An approximate curing time of the polymer resin 51 is 10 seconds or more, but may be increased or decreased depending on temperature of the conductive film 50.

As apparent from the foregoing, the present disclosure is advantageous in that ultrasonic vibration is additionally applied by the ultrasonic wave bonding device 130 during thermal compression using the conductive film 50, whereby the oxide film of the connection particles 51 can be removed without any damage applied to the camera module 10 due to use of ultrasonic vibration, and as a result, an electrical bonding force between the connection particles 51 and the electrodes 11, 21 of the camera module 10 can be increased to enhance the reliability of the product.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A device for bonding a flexible printed circuit board (PCB) to a camera module, the device comprising:
    a thermo-compression unit configured to apply heat and pressure to a conductive film between the camera module and the flexible PCB, the conductive film including an insulating polymer resin and conductive particles;
    an ultrasonic wave bonding unit configured to apply an ultrasonic wave to the conductive film;
    a memory configured to store a first period for which the thermo-compression unit applies heat and pressure to the conductive film and a second period for which the ultrasonic wave bonding unit applies the ultrasonic wave to the conductive film while the thermo-compression unit maintains application of heat and pressure; and
    a controller configured to:
        control the thermo-compression unit to apply the heat and pressure to the conductive film for the first period;
        control the ultrasonic wave bonding unit to apply the ultrasonic wave to the conductive film for the second period after the first period while the thermo-compression unit maintains application of heat and pressure; and
        control the thermo-compression unit to maintain application of the heat and pressure to the conductive film after the second period until the insulating polymer resin of the conductive film is cured.

2. The device of claim 1, wherein the insulating polymer resin includes any one of epoxy resin, polyimide resin, acrylic resin, polyester resin, polysulfone resin and polystyrene resin, or a mixture of two or more selected from the epoxy resin, polyimide resin, acrylic resin, polyester resin, polysulfone resin and polystyrene resin.

3. The device of claim 1, wherein the connection particles include any one of an Sn-based alloy, an Sn/Bi based alloy, an Sn/Zn based alloy, an Sn/Ag based alloy and an Sn/Ag/Au based alloy, or a mixture of two or more selected from the Sn-based alloy, Sn/Bi based alloy, Sn/Zn based alloy, Sn/Ag based alloy and the Sn/Ag/Au based alloy.

4. The device of claim 1, wherein the ultrasonic wave bonding unit comprises:
    an ultrasonic oscillator configured to output an electric energy at an ultrasonic wave frequency; and
    an ultrasonic vibrator configured to convert the electric energy from the ultrasonic oscillator to an ultrasonic wave and apply the ultrasonic wave to the conductive film.

5. The device of claim 1, wherein the thermo-compression unit comprises:
    a power supply unit configured to supply power;
    a thermal compressor positioned over the conductive film and configured to apply the heat and pressure to the conductive film based on the power from the power supply unit; and
    driving means configured to vertically move the thermal compressor.

6. The device of claim 1, wherein the controller is further configured to control amplitude and operation time of the ultrasonic wave generated by the ultrasonic wave bonding unit.

7. The device of claim 1, wherein the first period corresponds to a period when a temperature of the conductive film reaches a prescribed temperature at which the conductive particles of the conductive film starts to melt.

* * * * *